United States Patent [19]
Dreyer et al.

[11] Patent Number: 6,051,783
[45] Date of Patent: Apr. 18, 2000

[54] ELECTRONICS ENCLOSURE

[75] Inventors: Volker Dreyer, Lörrach; Thomas Werner, Maulburg, both of Germany

[73] Assignee: Endress + Hauser GmbH + Co., Maulburg, Germany

[21] Appl. No.: 08/721,112

[22] Filed: Sep. 26, 1996

[30] Foreign Application Priority Data

Sep. 28, 1995 [EP] European Pat. Off. ............ 95 115 324

[51] Int. Cl.[7] .................................................. H01L 23/28
[52] U.S. Cl. ..................................... 174/52.2; 264/272.11
[58] Field of Search ................................. 174/52.2, 52.1, 174/52.4; 257/787, 682; 29/855, 856; 264/272.11, 268

[56] References Cited

U.S. PATENT DOCUMENTS

| | | | |
|---|---|---|---|
| 3,772,452 | 11/1973 | Usowski | 174/52.2 |
| 3,838,316 | 9/1974 | Brown et al. | 174/52.2 |
| 5,121,289 | 6/1992 | Gagliardi | 361/380 |

FOREIGN PATENT DOCUMENTS

| | | |
|---|---|---|
| 33 37 991 | 4/1984 | Germany . |
| 42 33 185 | 1/1991 | Germany . |
| 5-45327 | 6/1993 | Japan . |
| 2 132 003 | 6/1984 | United Kingdom . |

*Primary Examiner*—Kristine Kincaid
*Assistant Examiner*—Hung V Ngo
*Attorney, Agent, or Firm*—Bose McKinney & Evans LLP

[57] ABSTRACT

The electronic enclosure for an electronics assembly belonging to an electrotechnical apparatus. The enclosure having one open end situated at the top in a filling position, through which a fluid potting compound is filled and which is closed off by a plug after filling of the potting compound. In the electronic enclosure a spill tube is disposed, the top end of which is located in the filling position level with the desired filling height in the electronic enclosure and the bottom end of which is in communication with a catchment space for the spill quantity of the potting compound flowing into the spill tube.

7 Claims, 2 Drawing Sheets

ELECTRONICS ENCLOSURE

BACKGROUND OF THE INVENTION

1. Field of the Invention

The invention relates to an electronics enclosure for an electronics assembly belonging to an electrotechnical apparatus, comprising an open end situated at the top in a filling position, through which a fluid potting compound is filled and which is closed off by a plug after filling of the potting compound.

2. Description of the Prior Art

For electronics enclosures of this kind always the same metered amount of potting compound is measured in quantity and filled to automate production. The problem in this respect is that due to production tolerances and differing sizes of electronic components the cavities to be potted may differ from one apparatus to another, so that the same filling quantity may result in differing filling heights which is undesirable f or the subsequent steps in production. If the filling quantity is metered so that the desired filling height is achieved even in the case of greatest possible remaining volume, spillage results when the remaining volume is smaller. If, on the other hand, the filling quantity is metered such that no spillage occurs even in the case of a smallest possible remaining volume, then the desired filling height fails to be achieved in the case of a greater remaining volume. A further cause f or differences in the filling height are also inaccuracies in metering the filling quantity.

SUMMARY OF THE INVENTION

The object of the invention is to provide an electronics enclosure of the aforementioned kind in which irrespective of fluctuations in production and metering and independently of differing component sizes the desired filling height is maintained precisely for always the same filling quantity metered.

This object is achieved according to the invention in that in the electronics enclosure a spill tube is disposed, the top end of which is located in the filling position level with the desired filling height in the electronics enclosure and the bottom end of which is in communication with a catchment space for the spill quantity of the potting compound flowing into the spill tube.

In filling the potting compound into the electronics enclosure according to the invention the filling quantity is metered so that even in the case of a maximally occuring remaining volume the desired filling height is attained. In the case of a smaller remaining volume the excess potting compound flows into the spill tube. This spill quantity then collects in the catchment space.

When the spill tube has a sufficiently large cross section, it may be closed off at the bottom end so that the lower part of the spill tube itself forms the catchment space.

When the electronics enclosure is connected at its end opposite the open end to the electrotechnical apparatus to which the electronics assembly belongs, then preferably in the region of the connection between the electronics enclosure and the electrotechnical apparatus an air chamber is formed which is separated from the space to be filled with potting compound. The air volume trapped in the air chamber acts in operation of the apparatus as a temperature barrier between the electrotechnical apparatus and the electronics enclosure, as a result of which the heat transport to the electronics assembly is reduced. When such an air chamber is provided, the spill tube can be in communication at its bottom end with the air chamber which then forms the catchment space for the spill quantity.

In both cases the total volume of the spill tube and catchment space is substantially larger than the maximally occuring spill quantity of potting compound. Accordingly, in the spill tube and in the catchment space an air volume remains which in operation takes up the overpressure resulting in the electronics enclosure when the potting compound expands on being heated.

BRIEF DESCRIPTION OF THE DRAWING

Further features and advantages of the invention will be appreciated from the following description of example embodiments illustrated in the drawings in which.

DESCRIPTION OF THE PREFERRED EMBODIMENTS

Figure 1:
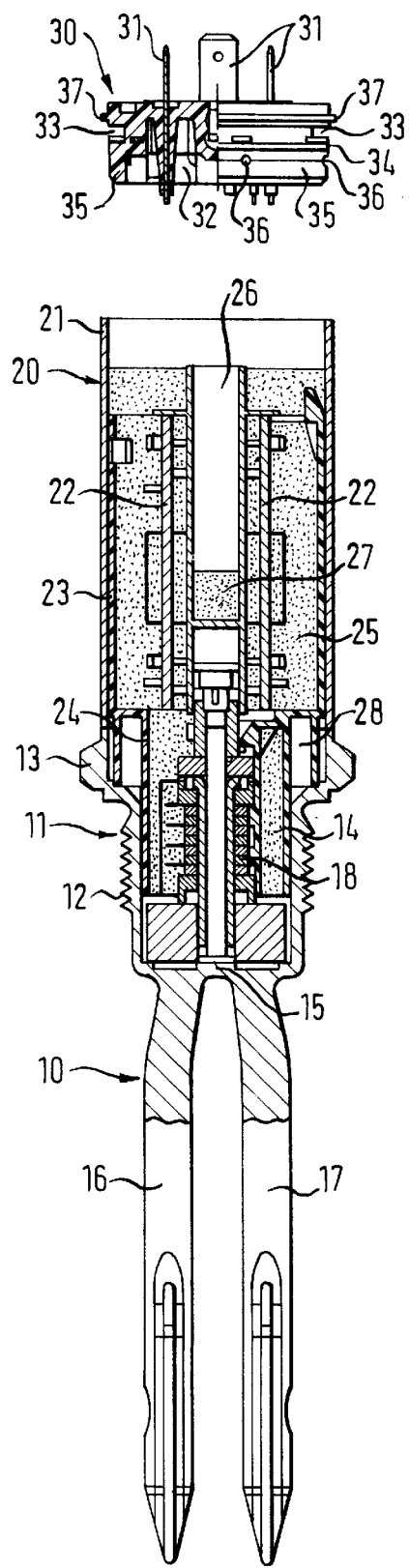
FIG. 1 is a partly sectioned view of an electromechanical level sensor with a first embodiment of the electronics enclosure according to the invention prior to insertion of the plug illustrated separately.
Figure 2:
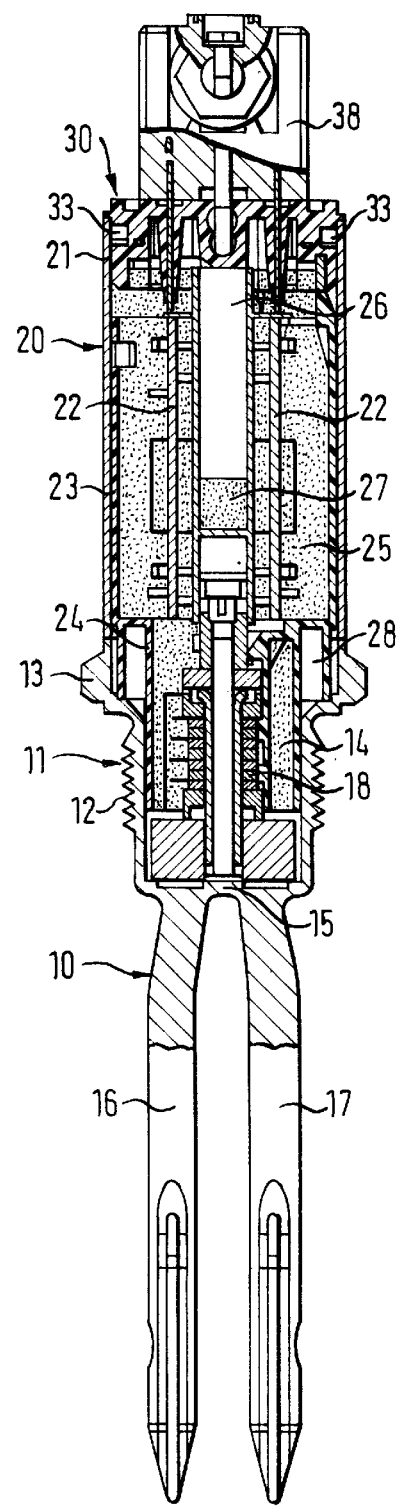
FIG. 2 shows the apparatus of FIG. 1 following insertion of the plug.

FIGS. 1 and 2 of the drawing show as an example for an electrotechnical apparatus in which the invention is applicable, an electromechanical level sensor 10 for monitoring a predetermined level in a container as is known for instance from U.S. Pat. No. 4,594,584. The level sensor 10 has a screw-in part 11 having a threaded section 12 and a hexagon head 13. The inner space 14 of the screw-in part 11 is hollow and closed off at its bottom end by a diaphragm 15 to which the ends of two oscillating rods 16 and 17 are secured. By means of the screw-in part 11 the level sensor 10 is secured in a threaded opening of the container wall so that the oscillating rods 16, 17 protrude into the interior of the container and come into contact with the material in the container when it has attained the level to be monitored.

In the hollow inner space 14 of the screw-in part 11 an electromechanical transducer arrangement 18 is disposed which is formed by a stack of piezoelectric elements. The transducer arrangement 18 contains excitation transducers and reception transducers. When an electrical AC voltage is applied to the excitation transducers they cause the diaphragm 15 to oscillate which is translated to the oscillating rods 16 and 17 so that they implement opposing oscillations transversely to their longitudinal direction. When mechanical oscillations act on the reception transducers they generate an electrical AC voltage having the frequency of the mechanical oscillations. A corresponding electronics assembly contains an amplifier which receives at its input the AC voltage generated by the reception transducers and at the output translates the amplified AC voltage to the excitation transducers. Thus, the mechanical oscillation system formed by the diaphragm 15 and the oscillating rods 16, 17 is located via the transducer arrangement 18 in the feedback circuit of the amplifier so that it is excited to oscillations at its natural resonant frequency.

The function of the level sensor 10 is based on the following phenomenon: when the oscillating rods 16, 17 are not in contact with the material in the container, the natural resonant frequency of the mechanical oscillation system is higher than when the oscillating rods 16, 17 dip into the material. The associated electronics assembly, therefore, comprises in addition an evaluation circuit which determines whether the frequency of the AC voltage output by the amplifier, which is equal to the frequency of the mechanical oscillation, is above or below a given threshold value. When this frequency is above this threshold value, this means that the oscillating rods 16, 17 oscillate in air, i.e. the material in the container has not attained the level to be monitored. When, on the other hand, the frequency is below the threshold value, this means that the material in the container has attained or exceeded the level to be monitored.

For accommodating the electronics assembly an electronics enclosure 20 is applied to the end face of the screw-in part 11 located outside of the container. The wall of the electronics enclosure 20 is formed by a metal tube 21 which is sealingly secured at one end to the screw-in part 11 and the other end of which is open. The electronics assembly is formed in the usual way by electronic components which are mounted on circuit boards 22. Into the interior of the electronics enclosure 20 a sleeve 23 formed by a plastics molding is inserted which is in contact with the inner surface of the metal tube 21 and surrounds the electronics assembly in the interior of the electronics enclosure 20. The sleeve 23 includes at its bottom end an extension 24 of smaller diameter which protrudes into the hollow inner space 14 of the screw-in part 11 and surrounds the transducer arrangement 18. The sleeve 23 facilitates mounting the electronics assembly in the electronics enclosure 20: the electronics assembly may be arranged outside of the electronics enclosure 20 in the sleeve 23 and then inserted together with the sleeve 23 in the electronics enclosure 20.

After the sleeve 23 with the electronics assembly has been inserted in the electronics enclosure 20, the cavities in the electronics enclosure 20 and in the screw-in part 11 are filled with a potting compound 25 which is filled through the open end of the electronics enclosure 20 in the fluid condition and then hardened. The potting compound is, for example, a soft, gel-like two-component silicone rubber which after mixing of the two components is fluid and is then vulcanized by additive cross-linking. For filling the potting compound the apparatus must be brought into the vertical position shown in FIG. 1 in which the open end of the electronics enclosure 20 is located upwards. In operation, however, the apparatus can be fitted in any position; usually level sensors of the kind described are mounted horizontally on the side wall of the container at the height of the level to be monitored. It is to be noted that the terms "top" an d "bottom" used in the following relate to the filling position as illustrated in the drawing.

FIG. 1 shows the apparatus after filling the potting compound 25 depicted dotted. For automating production always the same metered quantity of potting compound is measured in quantity and filled. The problem in this respect is that due to production tolerances and differing sizes of electronic components the cavities to be potted may differ from one apparatus to another, so that the same filling quantity may result in differing filling heights which is undesirable for the subsequent steps in production. If the filling quantity is metered so that the desired filling height is achieved even in the case of greatest possible remaining volume, spillage results when the remaining volume is smaller. If, on the other hand, the filling quantity is metered such that no spillage occurs even in the case of a smallest possible remaining volume, then the desired filling height fails to be achieved in the case of a larger remaining volume. A further cause for differences in the filling height are also inaccuracies in metering the filling quantity.

The illustrated electronics enclosure 20 is configured so that irrespective of fluctuations in production and metering and independently of differing component sizes the desired filling height is maintained precisely for always the same filling quantity metered. For this purpose a spill tube 26 is disposed in the electronics enclosure 20 so that its top end is located at the desired filling height below the top edge of the electronics enclosure. In the example embodiment illustrated in FIGS. 1 and 2 the spill tube 26 is arranged coaxial to the electronics enclosure 20. It is closed off at its bottom end and has a relatively large diameter so that its volume is substantially greater than the maximally occuring spill quantity of the potting compound 25. The filling quantity of the potting compound 25 is metered so that even in the case of a maximally occuring remaining volume the desired filling height is attained. In the case of a smaller remaining volume the excess potting compound flows into the spill tube 26. This spill quantity 27 then collects in the lower part of the spill tube 26 serving as a catchment space. However, due to the relatively large volume of the spill tube a considerable volume of air remains in the spill tube 26 even in the case of a maximally occuring spill quantity 27.

Thus, the filling height of the potting compound 25 in the electronics enclosure 20 is always maintained precisely at the level of the top edge of the spill tube 26.

In the transition region between the electronics enclosure 20 and the screw-in part 11, molded to the sleeve 23, is an annular air chamber 28 which has no connection to the volume taken up by the potting compound 25 so that the air chamber 28 remains filled with air even after filling of the potting compound 25.

Immediately after filling the potting compound 25, whilst it is still in the fluid condition, the open end of the electronics enclosure 20 is closed off by a plug 30 which is illustrated in FIG. 1 above the electronics enclosure 20 in the still open condition. The plug 30 is a plastics molding produced, for example, by injection molding and serves, apart from closing off the electronics enclosure 20, also to connect the electronics assembly accommodated in the electronics enclosure 20 to external leads. For this purpose metallic contact members 31 are inserted in the plug 30 which feature on the underside of the plug 30 facing the interior of the electronics enclosure 20 protruding contact tips and form on the outside top face of the plug 30 flat terminals onto which a connector part is mountable. Formed in the underside of the plug 30 is a recess 32, and a periperal groove runs around the plug 30. The rim portion 34 of the plug 30 located underneath the peripheral groove 33 translates into a peripheral rim 35 which surrounds the recess 32 and has a slightly smaller outer diameter than the rim portion 34. Passing through this peripheral rim from the recess 32 to the outer peripery are vent holes 36. A protruding ridge 37 formed above the peripheral groove 33 limits penetration of the plug 30 into the electronics enclosure 20. When the plug 30 is fully introduced the ridge 37 rests on the top edge of the electronics enclosure 20 (FIG. 2).

When the plug 30 is inserted in the open end of the electronics enclosure 20, air present above the surface of the potting compound 25 is able to escape to the environment through the vent holes 36. In further introduction of the plug 30 the tips of the contact members 31 and the peripheral rim 35 dip into the potting compound 25, as a result of which a certain quantity of potting compound is further displaced which flows off into the spill tube 26. Once the plug 30 as been fully introduced (FIG. 2) the spill tube 26 extends up into the recess 32 so that also a part of the recess 32 is filled with potting compound 25.

Between the rim portion 34 of the plug 30 and the inner surface of the metal tube 21 a gap exists which is dimensioned so that potting compound having penetrated into the space between the peripheral rim 35 and the metal tube 21, is drawn upwards into the peripheral groove 33 by the capillary action. This ascending potting compound collects in the peripheral groove 33 thus achieving two effects: on the one hand this prevents the ascending potting compound from emerging to the outside and, on the other, the potting compound having collected in the peripheral groove 33 provides, when it has hardened, a good sealing of the gap between the plug 30 and the wall of the electronics enclosure 20.

FIG. 2 shows the apparatus in its fully assembled condition. The tips of the contact members 31 extending downwards from the underside of the plug 30 engage mating contact members of the electronics assembly. Mounted on the flat terminals of the contact members 31 extending upwards is a connector member 38 joined to a cable, as a result of which the connection between the cable and the electronics assembly in the electronics enclosure 20 is made.

Soft potting compounds of the kind used in this case have the property that they are good heat conductors and expand relatively strongly when heated. The air volume trapped in the air chamber 28 acts in operation of the apparatus as a temperature barrier between the screw-in part 11 connected to the container and the electronics enclosure 20, as a result of which the heat transport from the level sensor to the electronics assembly is reduced. The air volume present in the spill tube 26 receives the overpressure generated in the electronics enclosure 20 when the potting compound expands on being heated.

Figure 3:
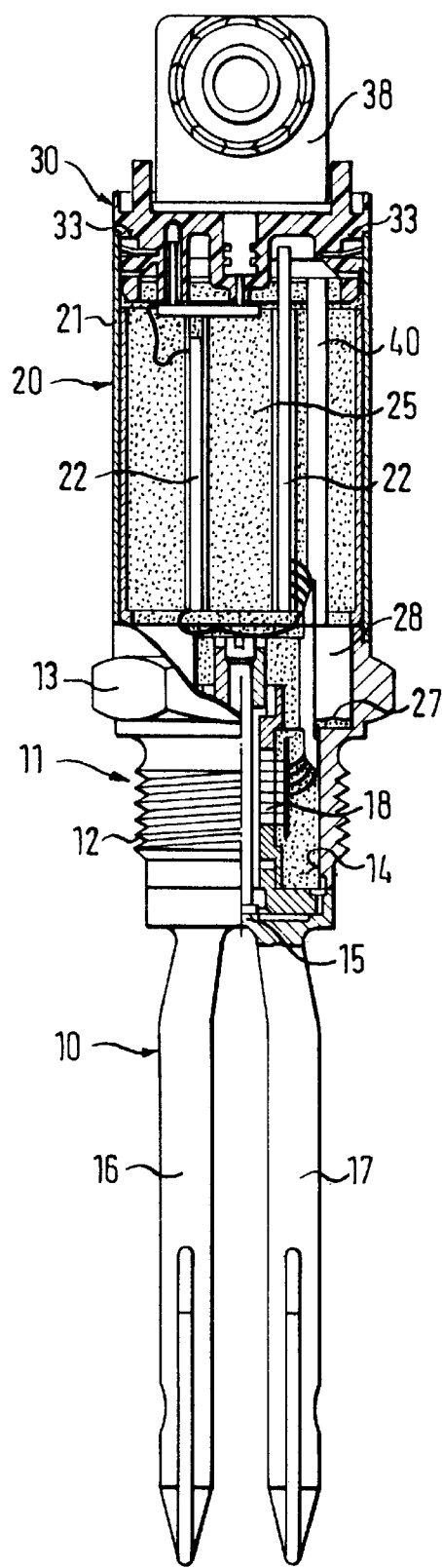
FIG. 3 is a partly sectioned view of an electromechanical level sensor with a second embodiment of the electronics enclosure according to the invention in the assembled condition.

FIG. 3 shows a modified embodiment of the electronics enclosure 20 which is fitted to a level sensor of the same kind as in the FIGS. 1 and 2. The components of the level sensor 10 and the electronics enclosure 20 are substantially the same as those of the embodiment of FIGS. 1 and 2 and are thus identified by the same reference numerals as in the FIGS. 1 and 2. The only substantial difference between the embodiment of FIG. 3 and that of FIGS. 1 and 2 resides in the spill tube designated 40 in FIG. 3: the spill tube 40 is no longer located coaxial to the electronics enclosure 20, it instead being located at a position offset with respect to the axis and it is in communication at the bottom end with the air chamber 28 formed in the screw-in part 11. Accordingly, in this case, the air chamber 28 also serves as a catchment space for the spill quantity 27 of the potting compound 25 collecting at the bottom of the air chamber 28. Furthermore, any overpressure materializing in the electronics enclosure 20 is taken up by the total air volume in the air chamber 28 and in the spill tube 40. For both reasons the spill tube 40 may be configured with a substantially smaller cross section than in the case of the embodiment of FIGS. 1 and 2.

We claim:

1. An enclosure for an electronic assembly, said electronic assembly being associated with an electrotechnical apparatus, said enclosure comprising:

an open end located at the top of said enclosure when said enclosure is in a filling position, said open end being used for introducing a fluid potting compound into said enclosure and being closed off by a plug after said enclosure has been filled with said potting compound;

a spill tube having a top end and a bottom end, said spill tube being disposed in said enclosure such that said top end of said spill tube is level with a desired filling height of said potting compound in said enclosure when said enclosure is in said filling position, and said bottom end of said spill tube is in communication with a catchment space such that a spill quantity of said potting compound in excess of said desired filling height of said potting compound flows into said spill tube and collects in said catchment space.

2. The enclosure as set forth in claim 1, wherein said enclosure has an opposite end which is opposite to said open end, said opposite end being connected to said electrotechnical apparatus.

3. The enclosure as set forth in claim 2, further comprising means defining an air chamber formed in a region of the connection between said opposite end of said enclosure and said electrotechnical apparatus.

4. The enclosure as set forth in claim 3, wherein said air chamber is separated from said catchment space for said spill quantity of said potting compound.

5. The enclosure as set forth in claim 3, wherein said bottom end of said spill tube is connected to said air chamber, said air chamber forming said catchment space for said spill quantity of said potting compound.

6. The enclosure as set forth in claim 1, wherein the bottom end of said spill tube is closed and said spill tube includes a lower portion that forms said catchment space for said spill quantity of said potting compound.

7. The enclosure as set forth in claim 1, wherein said enclosure includes a wall, and said plug has an outer periphery and includes a peripheral groove, wherein a gap exists between said outer periphery of said plug and said wall of said enclosure, said gap being dimensioned such that said potting compound is drawn into said peripheral groove of said plug by capillary action.

* * * * *